Figure 1:
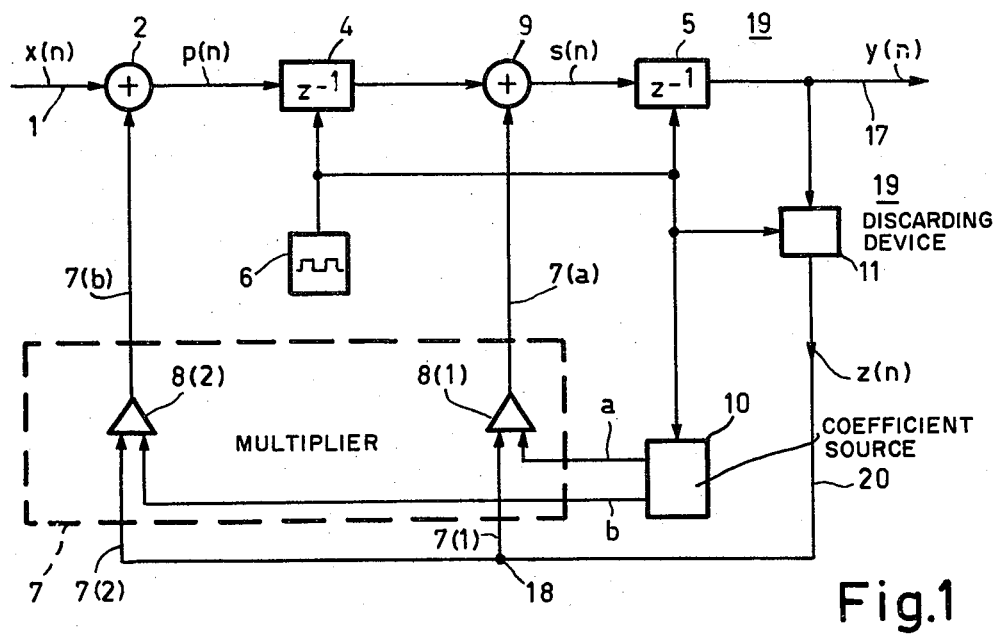

United States Patent [19]
Claasen et al.

[11] B 3,997,770
[45] Dec. 14, 1976

[54] RECURSIVE DIGITAL FILTER

[75] Inventors: Theodoor Antonius Carel Maria Claasen; Wolfgang Friedrich Georg Mecklenbrauker; Johannes Bernhard Heinrich Peek, all of Eindhoven, Netherlands

[73] Assignee: U.S. Philips Corporation, New York, N.Y.

[22] Filed: June 28, 1974

[21] Appl. No.: 484,121

[44] Published under the second Trial Voluntary Protest Program on March 16, 1976 as document No. B 484,121.

[30] Foreign Application Priority Data

July 9, 1973 Netherlands ...................... 7309534
Sept. 20, 1973 Netherlands ...................... 7312946

[52] U.S. Cl. ............................. 235/152; 235/156
[51] Int. Cl.² ........................................ G06F 15/20
[58] Field of Search ........................... 235/152, 156
[56] References Cited
UNITED STATES PATENTS

| | | | |
|---|---|---|---|
| 3,506,813 | 4/1970 | Trimble | 235/152 |
| 3,619,586 | 11/1971 | Hoff et al. | 235/156 |
| 3,749,895 | 7/1973 | Kao | 235/152 |
| 3,780,279 | 12/1973 | Stover | 235/156 X |

OTHER PUBLICATIONS

Parker, S. R. et al., "Limit-Cycle Oscillations in Digital Filters", In IEEE Trans. Circuit Theory CT-18(6) pp. 687–697, Nov. 1971.

*Primary Examiner*—R. Stephen Dildine, Jr.
*Attorney, Agent, or Firm*—Frank R. Trifari; Daniel R. McGlynn

[57] ABSTRACT

Recursive digital filter comprising at least two digital delay devices, a multiplying device having two inputs which are coupled to one another in a common branch point, a summing device from which a sum signal is derived the magnitude of which is at least equal to the sum of the output signal of the multiplying device, and a feedback circuit connected between the output of the summing device and the distribution point. The feedback circuit is provided with a discarding device which acts on numbers given in sign-and-magnitude representation and which by means of magnitude truncation restricts the number of bits of the numbers applied to the branch point.

11 Claims, 12 Drawing Figures

RECURSIVE DIGITAL FILTER

The invention relates to a recursive digital filter for producing a digital output signal which in a predetermined manner is related to a digital input signal. The filter is provided with an input circuit to which the digital input signal is applied, and an output circuit from which the digital output signal is derived, at least two digital delay devices, and a digital multiplying device having at least two input lines and an output circuit. The two input lines of the digital multiplying device are coupled to one another at a common branch point; each line has a digital signal applied to it which is related to the output signal. At least two filter coefficients for producing digital product signals are also applied to the multiplying device which are derived from a source of filter coefficients which correspond to the relationship between the input signal and the output signal of the filter. The output circuit of the multiplying device is connected to inputs of a summing device for summing the product signals produced by the multiplying device, and the output circuit of the summing device is connected to a feedback circuit for generating a feedback signal. The feedback circuit includes at least a first one of the delay devices and has its output coupled to the branch point. The filter coefficients are represented by single binary numbers and the digital signals are represented by a sequence of binary numbers in fixed-point representation ed and each comprising a given number of bits.

For definitions of the terminology used in the preceding paragraph we refer to the paper: "Terminology in Digital Signal Processing" in IEEE Transactions on Audio and Electroacoustics, Vol. Au 20, No. 5, Dec. 1972, pag. 322–337. The terminology proposed in the paper will be used hereinafter also.

Although in theory the use of one or more such recursive digital filters of the above-described type in conjunction with one or more non-recursive digital filters permits a large number of different transfer functions to be realized, the field of application of recursive digital filters realized in practice is confined within narrow limits, for in practice such recursive filters suffer from the serious oscillation phenomena generally referred to as "limit cycles" which are due to necessary quantization of the binary numbers to be processed in the recursive filter.

It is an object of the present invention to considerably extend the field of application of a recursive digital filter of the abovedescribed type by optimum reduction of the possibility of occurrence of the said oscillation phenomena.

For this purpose according to the invention the feedback circuit is a cascade circuit which in addition to the said first delay device at least comprises a discarding device for generating a digital feedback signal which is applied to the distribution point and is formed by a sequence of quantized binary numbers which each comprise only a limited number $m$ of bits, to which discarding device a digital input signal is applied which is related to the digital sum signal and is in the form of a sequence of binary numbers which each comprise more than $m$ bits, which discarding device discards from binary numbers which are equivalent to the binary numbers in the input signal of the discarding device and are given in sign-and-magnitude and fixed-point representation those bits which are less significant than the least significant bit of the first $m$ significant bits in the binary number to be quantized.

Figure 5:
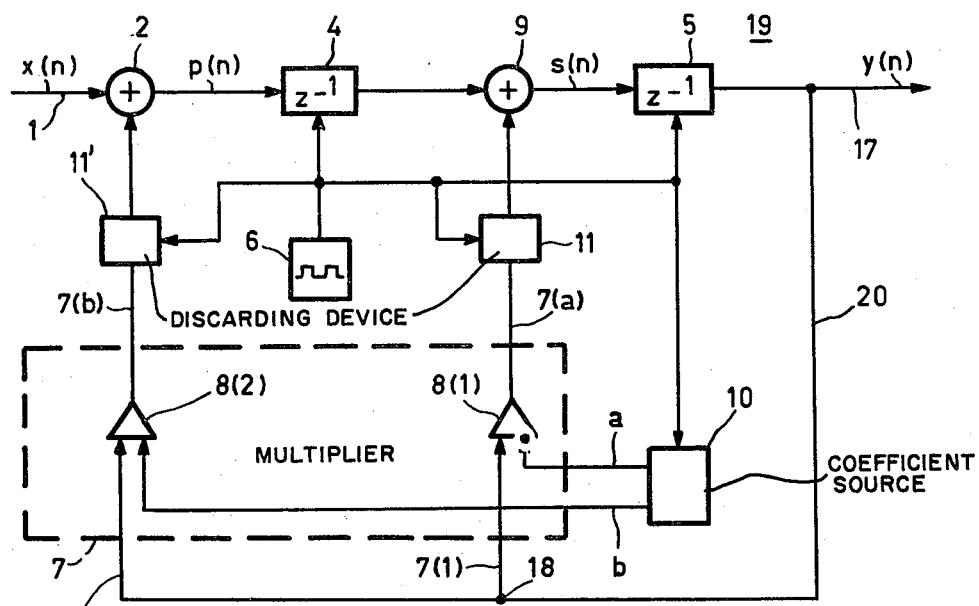
Figure 2:
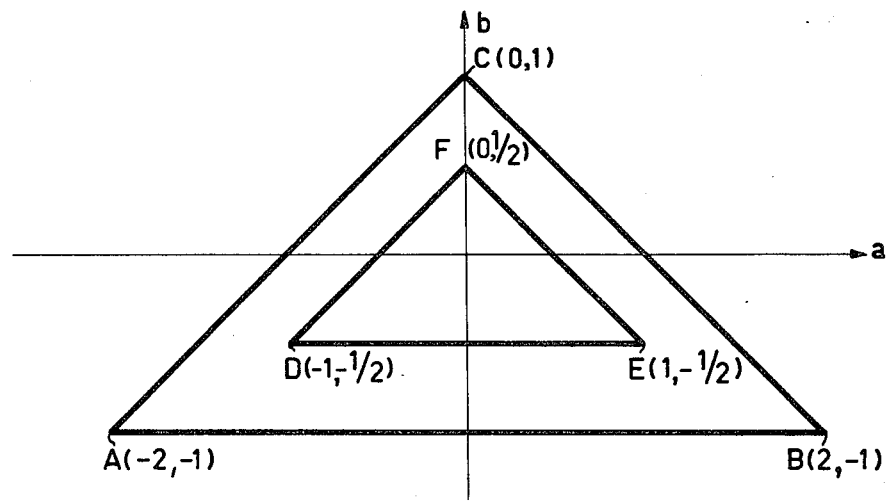
Figure 3:
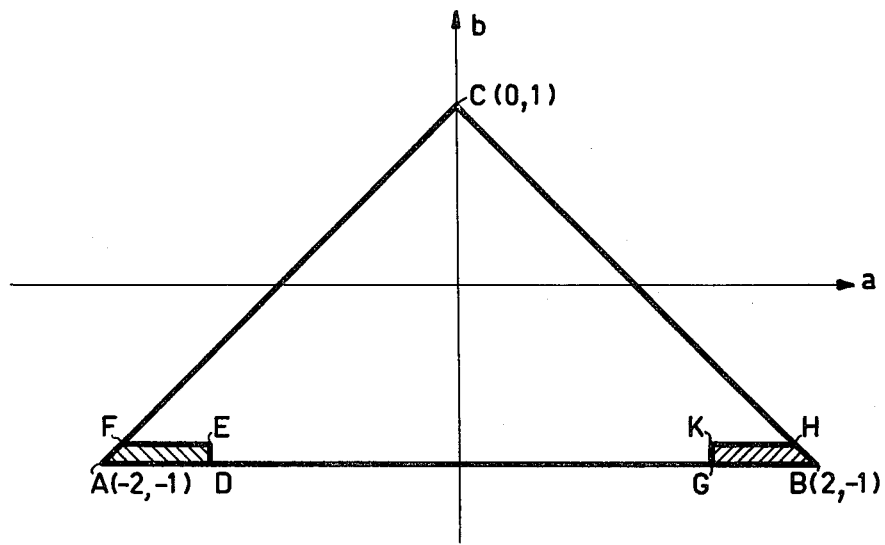
Figure 4:
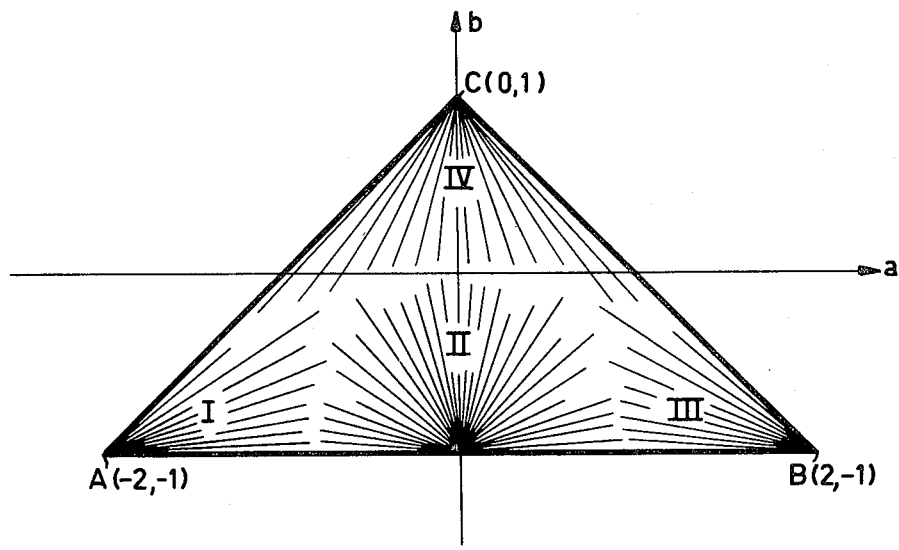
Figure 6:
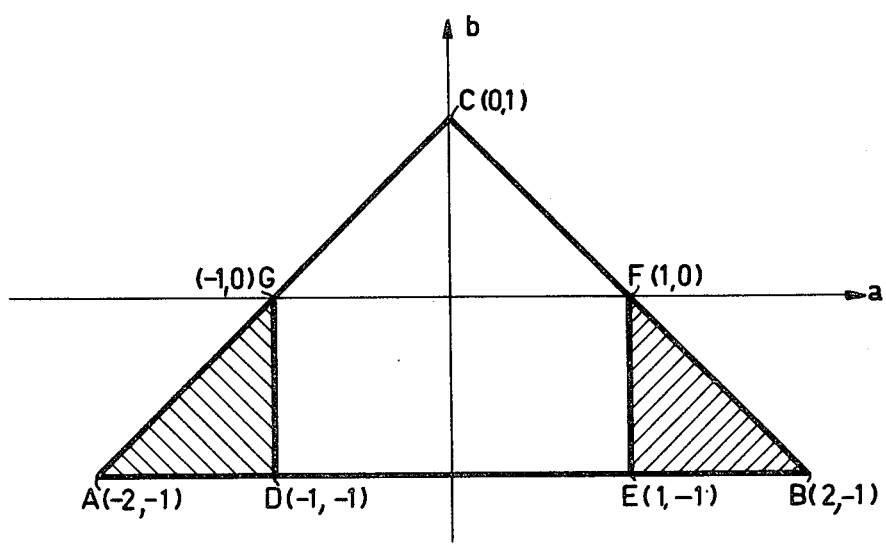
Figure 7:
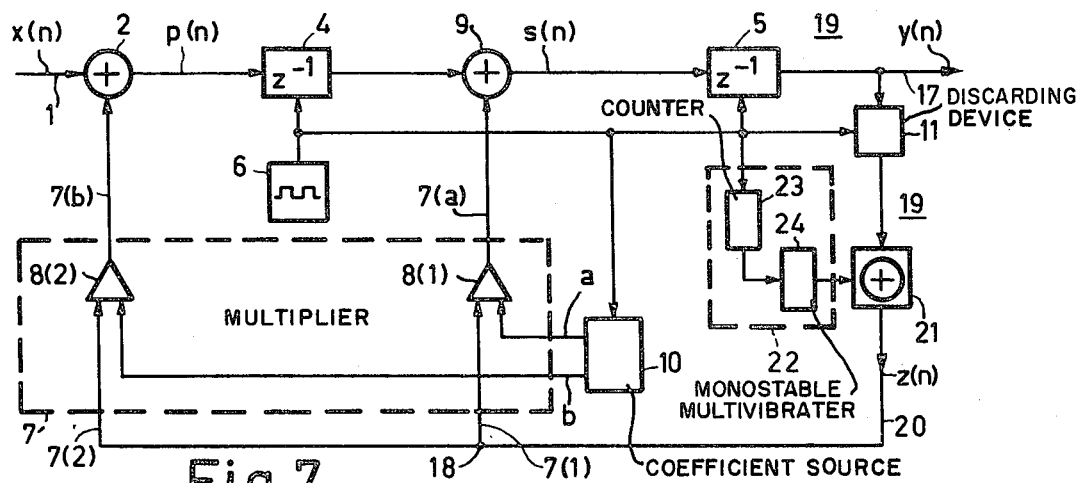
Figure 8:
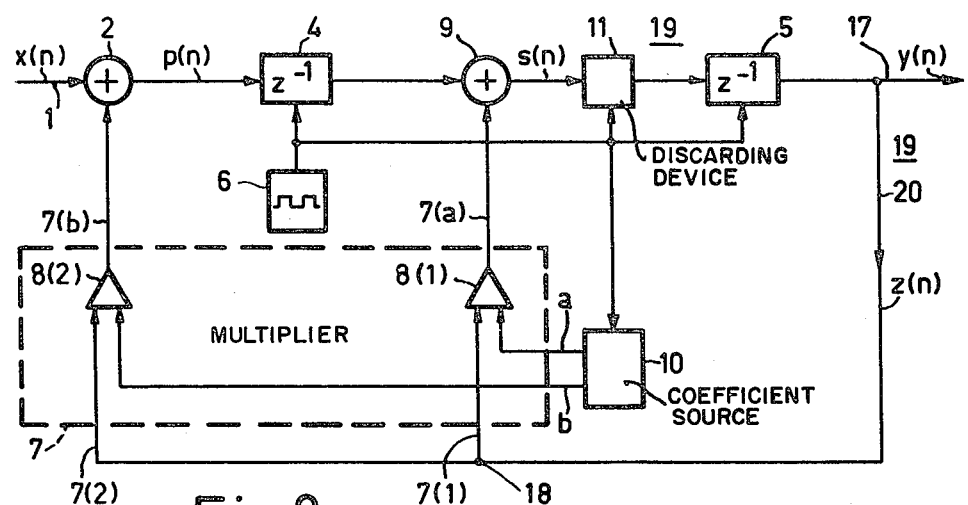
Figure 9:
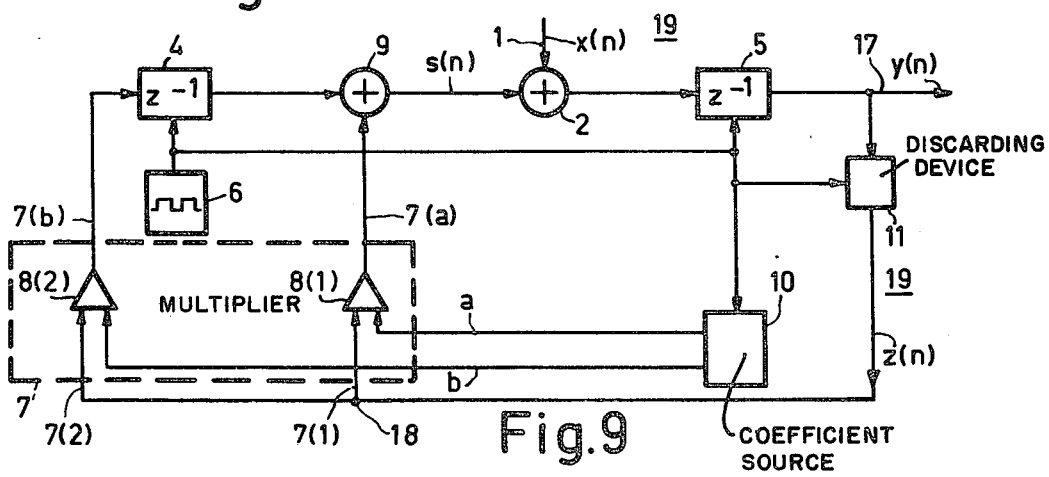
Figure 10:
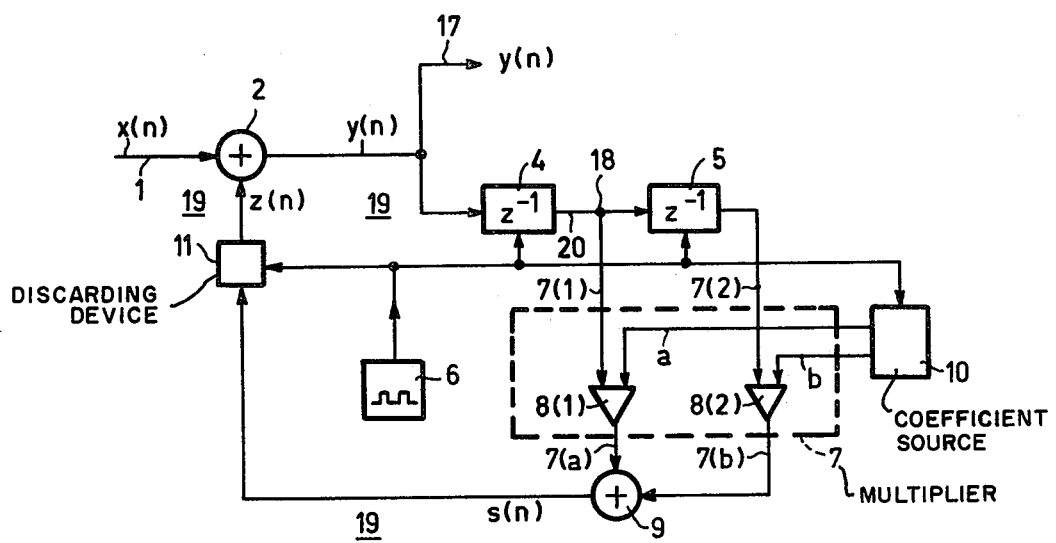
Figure 11:
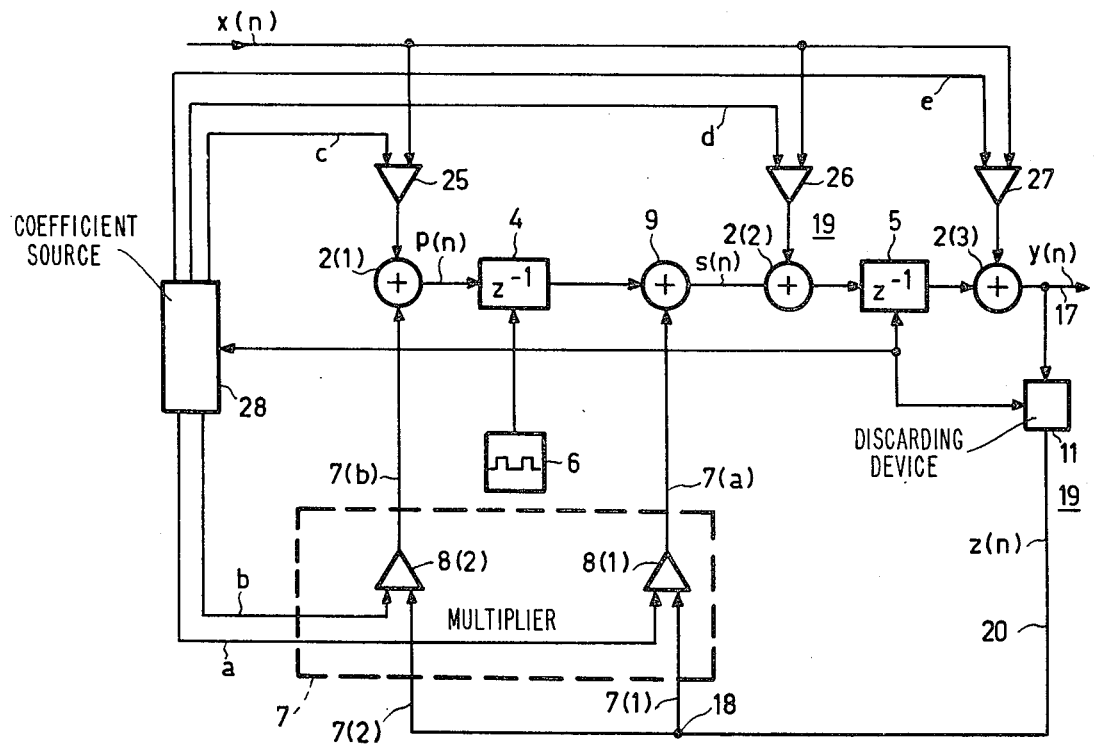
Figure 12:
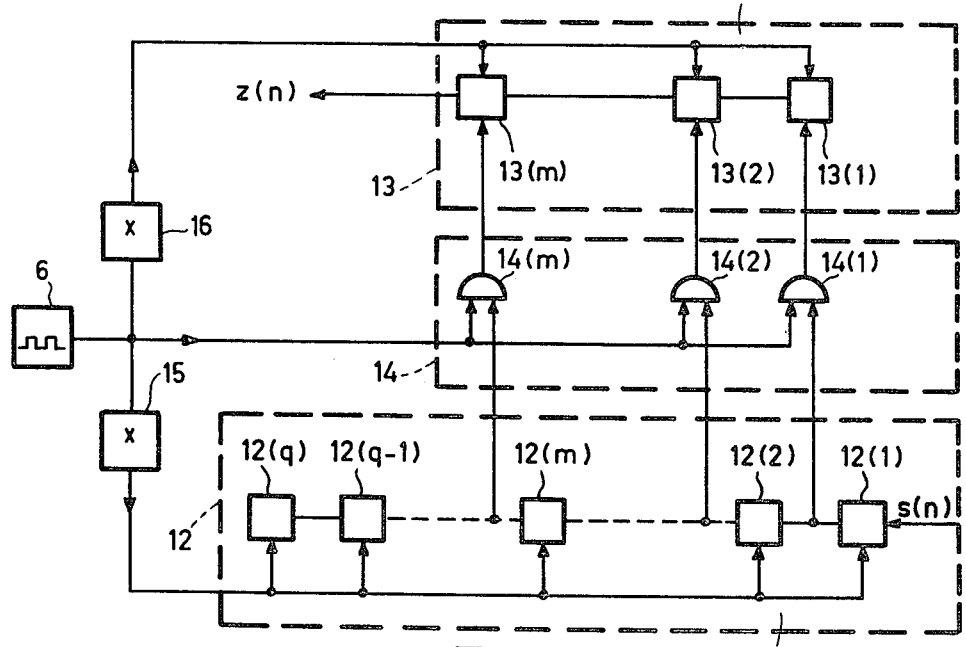

Embodiments of the invention will now be described, by way of example, with reference to the accompanying diagrammatic drawings, in which:

FIG. 1 is a second-order recursive digital filter provided with the step according to the invention, FIG. 2 is a stability diagram of a recursive second-order digital filter, FIG. 3 is a stability diagram of the second-order recursive digital filter provided with the step according to the invention as shown in FIG. 1, FIG. 4 is the linear stability region of a second-order recursive digital filter, which region is divided into regions which each contain the filter coefficients for a given type of filter, FIG. 5 is a second-order recursive digital filter provided with two discarding devices, FIG. 6 is a stability diagram associated with the filter shown in FIG. 5, FIG. 7 is an elaborate embodiment of the recursive digital filter according to the invention, FIGS. 8 and 9 each show a modified embodiment of the recursive digital filter according to the invention shown in FIG. 1, FIG. 10 shows a second-order recursive digital filter in the form of the transpose configuration of the filter of FIG. 1, FIG. 11 shows a digital filter which comprises a second-order recursive digital filter section provided with the step according to the invention and non-recursive digital filter sections, and FIG. 12 shows an embodiment of a discarding device.

FIG. 1 shows a second-order recursive digital filter for producing a digital output signal $y(n)$ which is related in a predetermined manner to a digital input signal $x(n)$. The input signal $x(n)$ is applied to the filter shown via an input 1 and the output signal $y(n)$ is derived from the filter via an output 17. The signals $x(n)$ and $y(n)$ each comprise a sequence of binary numbers in fixed-point representation which occur at instants $t = nT$, where $n = 0, 1, 2 \ldots$ and at a given frequency $1/T$. Of said numbers, which each comprise a given number of bits (for example 14 bits), the numbers in the signal $x(n)$ each give the magnitude and the sign at a given instant $nT$ of an analog information signal while the numbers in the signal $y(n)$ each give the magnitude and the sign at a given instant $nT$ of the filtered version of said analog information signal. For this purpose the numbers each conventionally comprise one sign bit and a plurality, for example 13, of magnitude bits. This manner of representing binary signals is known by the name of "sign-and-magnitude" representation.

To realize the desired transfer characteristic the filter comprises two digital delay sections 4 and 5, a multiplying device 7 and a summing device 9. The input lines 7(1) and 7(2) of the multiplier 7, which has at least two input lines 7(1) and 7(2) and two output lines 7(a) and 7(b), are coupled to one another in a common branch point 18; a digital signal related to the output signal $y(n)$ is applied to each of the input lines 7(1) and 7(2) while two filter coefficients $a$ and $b$ for producing digital product signals, which signals each are derived from one of the output lines 7(a) and 7(b) and each are formed by the product of a digital signal applied to the multiplying device 7 and a filter coefficient, are also applied to the multiplying device 7. The filter coefficients $a$ and $b$ are derived from a source 10 (for example a read-only memory) of a given number of filter coefficients and correspond to the relationship between the input signal $x(n)$ and the output signal $y(n)$. In addition, the filter coefficients each are also formed by a binary number, which numbers are given in fixed-point representation and in sign-and-magnitude representation and each comprise one sign bit and a given number, for example 7, of magnitude bits.

The outputs $7(a)$ and $7(b)$ of the multiplying device 7 each are coupled to an input of the summing device 9 from which a digital sum signal $s(n)$ is derived the magnitude of which is at least given by the mathematical sum of the signals which are related to the product signals and are applied to the summing device 9. The sum signal is applied to a feedback circuit 19 for producing a feedback signal $z(n)$. For this purpose the feedback circuit 19 comprises at least a first one of the delay devices, in the embodiment shown a delay device 5, the input of which is coupled to the output of the summing device 9 and the output of which is coupled to the common branch point 18.

The delay times of the delay devices are determined by clock pulses which are produced at a given frequency by a clock pulse generator 6 which is connected to the delay devices and also controls the source 10 of the filter coefficients. The frequency of these clock pulses is selected to be equal to the frequency 1/T at which the numbers in the signals $x(n)$ and $y(n)$ occur.

Like the signals $x(n)$ and $y(n)$ the signals $s(n)$ and $z(n)$ are formed by a sequence of binary numbers which occur at the clock frequency 1/T and are given in fixed-point representation and in sign-and-magnitude representation.

In the embodiment shown the input 1 is in the form of an input of a second summing device 2 to which the information signal $x(n)$ is applied and the output of which is connected to the delay device 4, while the summing device 9 is connected in the manner shown between the output of the delay device and the input of the delay device 5, the output 17 of the filter being connected to the output of the delay device 5 in the feedback circuit 19. An output signal is derived from the feedback circuit 19 via an output line 20 and is applied as a feedback signal $z(n)$ to the branch point 18.

In the embodiment shown the multiplying device 7 comprises two multipliers 8(1) and 8(2) which each have one input connected to input lines 7(1) and 7(2) respectively while their outputs are connected to output lines $7(a)$ and $7(b)$ respectively. In particular, in this embodiment the input lines 7(1) and 7(2) of the multiplying device 7 are directly connected to the branch point 18. Thus, to either multiplier 8(1) and 8(2) the feedback signal $z(n)$ is applied for multiplication of this signal $z(n)$ by the filter coefficients $a$ and $b$ respectively to yield the product signals $a \cdot z(n)$ and $b \cdot z(n)$ respectively which appear at the output lines $7(a)$ of the multiplier 8(1) and $7(b)$ of the multiplier 8(2) respectively.

The signal $b \cdot z(n)$ which appears at the output of the multiplier 8(2) is applied to the summing device 2 to produce a signal $p(n) = x(n) + b \cdot z(n)$; the signal $a \cdot z(n)$ which appears at the output of the multiplier 8(1) is applied to the summing device 9. In addition to the signal $a \cdot z(n)$ there is applied to the summing device 9 the output signal $p(n)$ from the summing device 2, however, by way of the delay device 4 which delays the signal $p(n)$ a clock pulse period T of the clock pulse generator 6. Thus the output signal from the delay device 4 can be represented by $p(n-1) = x(n-1) + b \cdot z(n-1)$. From the two input signals the summing device 9 produces the sum signal $s(n)$ which is given by the mathematical sum $s(n) = a \cdot z(n) + b \cdot z(n-1)$. In the manner shown in the Figure, the sum signal $s(n)$ is applied to the feedback circuit 19 and specifically to the delay device 5 from which the output signal of the summing device 9, which signal is delayed a clock pulse period T, is derived. In the embodiment shown the output signal of the delay device 5, which may be represented by $s(n-1)$, is taken from the output 17 of the filter as the output signal $y(n)$ and also is used to produce the feedback signal $z(n)$.

Because the bits in the various binary numbers in the signals $x(n)$, $y(n)$, $p(n)$ and $z(n)$ and the bits in the binary filter coefficients $a$ and $b$ can be used in the filter both in series and in parallel and can be stored in the delay devices 4 and 5, in the usual manner no difference will be made in the present specification and in the accompanying drawings between numbers the component bits of which are used in series and the numbers in which they are used in parallel, unless explicitly mentioned.

However, by the quantization used in such filters in order to restrict the storage capacity of the delay devices to a finite number of bits, the stability of the recursive filter is particularly adversely affected. This is illustrated in FIG. 2. FIG. 2 shows a system of coordinates in which the values of the filter coefficients $a$ and $b$ are plotted as abscissae and ordinates respectively. The triangle ABC which is shown in this co-ordinate system and the vertices of which are given by co-ordinates $(-2;-1)$; $(2;-1)$ and $(0;1)$ encloses a region of what is referred to as linear stability. This term means that in the case of infinitely large storage capacity of the delay devices 4 and 5 the recursive filter is stable for those combinations of filter coefficients $a$ and $b$ which correspond to points situated in the area enclosed by the triangle ABC. In the known recursive digital filters, however, the number of combinations of $a$ and $b$ which relate to a stable filter is considerably restricted. More particularly, owing to the quantization used, those combinations of filter coefficients $a$ and $b$ for which the recursive filter is stable are given by points in the region enclosed by a triangle DEF shown in FIG. 2, which region lies within the triangle ABC and will be referred to as non-linear stability region. The vertices of the triangle DEF are given by the co-ordinates $(-1;-\frac{1}{2})$; $(1;-\frac{1}{2})$; $(0;\frac{1}{2})$ respectively.

For those combinations of filter coefficients $(a, b)$ which are given by points situated in the region outside the triangle DEF and inside the triangle ABC oscillation phenomena are produced in the filter which are known as limit cycles. These oscillation phenomena seriously restrict the field of application of the recursive filter, for they prevent the realization of high-quality filters free from such limit cycles.

It is an object of the present invention to considerably extend the field of application of the recursive digital filter by reducing the occurrence of the oscillation phenomena for those combinations of filter coefficients which are given by points situated in the region outside the triangle DEF and inside the triangle ABC. For this purpose according to the invention the feedback circuit 19 of the filter comprises a cascade circuit which in addition to the first delay device 5 includes at least one discarding device 11 for producing the digital feedback signal $z(n)$ which is applied to the common branch point 18 and is formed by a sequence of quantized binary members which each comprise only a restricted number $m$ of bits, to which discarding device a digital input signal related to the sum signal $s(n)$ is applied which is formed by a sequence of binary numbers which each comprise more than $m$ bits, the discarding device discarding from binary numbers which are equivalent to the binary numbers in the input signal to the discarding device and are given in sign-and-magnitude representation and fixed-point representation those bits which are less significant than the least significant bit of the first $m$ significant bits in the number to be quantized. This method of quantizing is known by the name magnitude truncation.

In the embodiment shown in FIG. 1 the discarding device 11 is included between the outputs of the delay device 5 and the common branch point 18, and the sum signal $s(n-1)$ which appears at the output of the delay device 5 is directly applied to the discarding device, which converts the signal $s(n-1)$ into the signal $z(n)$ which differs from the signal $s(n-1)$ in the number of bits per binary number.

If particularly the delay sections 4 and 5 are suitable for storing binary numbers which apart from a sign bit comprise $q = m + r$ (for example 13) magnitude bits and the magnitude of each filter coefficient in fixed-point representation is represented by $r$ (for example 7) magnitude bits and no discarding is used, owing to the multiplication of the said two numbers the magnitudes of the members in the signal $s(n)$ are given by $q + r = m + 2r$ bits (in this example 20 bits). However, by means of the discarding device 11 included in the feedback circuit 19 first the $r$ least significant bits are discarded from the stored $m + r$ bits so that the number of bits of the numbers in the signal $z(n)$ is equal to $m$ and the product signals $a \cdot z(n)$ and $b \cdot z(n)$ are built up of numbers which each comprise $q = m + r$ bits, which number of bits is equal to the number which can be stored in the delay devices 4 and 5 for a single number. Although in the summing device 2 the information signal $x(n)$ is added to the product signal $b \cdot z(n)$, the output signal $p(n)$ of the summing device 2 also contains numbers which each comprise only $m + r$ bits, for each number in the signal $p(n)$ comprises a number of bits which is equal to the number of bits of that number of the two numbers $x(n)$ and $b \cdot z(n)$ to be summed which comprises the larger number of bits. In the embodiment shown, in which each number in the signal $x(n)$ and in the signal $b \cdot z(n)$ comprises 13 magnitude bits, the number of magnitude bits of the numbers in the signal $p(n)$ also is 13 (that is $m + r$). Similarly the sum signal $s(n)$ obtained by summation of the signals $p(n-1)$ and $a \cdot z(n)$ is formed by numbers which each comprise only $m + r$ (that is 13) bits.

The use of the steps according to the invention, that is to say the use of magnitude truncation to considerably restrict the number of bits which make up the numbers applied to the branch point 18, which truncation is effected in the circuit comprising the output of the summing device 9, the feedback circuit 19 and the branch point 18, ensures that the non-linear stability region enclosed by the triangle DEF in FIG. 2 is appreciably increased so as to substantially coincide with the entire region of linear stability. This is illustrated in FIG. 3. In FIG. 3, in analogy with FIG. 2 the region of linear stability is enclosed by the triangle ABC. It was found that the use of the steps according to the invention causes limit cycles to occur only for combinations of filter coefficients $(a, b)$ which are given by points situated in the regions enclosed by the shaded trapeziums ADEF and GBHK. The vertices of the trapezium ADEF are given by the co-ordinates $(-2;-1)$; $(-1.4;-1)$; $(-1.4;-0.94)$; $(-1.94;-0.94)$ respectively, and the vertices of the trapezium GBHK are given by the co-ordinates $(1.4;-1)$; $(2;-1)$; $(1.94;.0.94)$ $(1.4;-0.94)$ respectively.

As FIG. 3 shows, in spite of the introduction of the non-linear operation of magnitude truncation substantially all combinations of filter coefficients $(a, b)$ which correspond to the points within the triangle ABC can be used in the recursive filter described without the stability of the filter being adversely affected. As a result, the possibilities of using the filter are extended so that all types of filters can be realized without the occurrence of undesirable limit cycles, as will be seen by comparing FIGS. 2 and 3 with FIG. 4.

FIG. 4 shows, to the same scale as is used in FIGS. 2 and 3, the triangle ABC which encloses the region of linear stability. In this triangle, fanwise shadings schematically show regions I, II, III and IV which contain points for combinations of filter coefficients which correspond to high-pass filters (I), band-pass filters (II), low-pass filters (III) and integrating networks (IV) respectively.

Not only owing to the described special non-linear operation of magnitude truncation but also owing to the location of the discarding device, i.e. in the feedback circuit 19, the region of non-linear stability is extended from the region within the triangle DEF shown in FIG. 2 to the region within the entire triangle ABC except the trapeziums ADEF and GBHK shown in FIG. 3.

That the location of the discarding device is of essential importance will be illustrated with reference to FIGS. 5 and 6. FIG. 5 shows a recursive digital second-order filter which largely corresponds to the filter shown in FIG. 1, elements which correspond to FIG. 1 being denoted by like reference numerals. The second-order filter shown in FIG. 5 also comprises an input 1, which is the input of a summing device 2, delay devices 4 and 5, a multiplying device 7 having two multipliers 8(1) and 8(2), a source 10 of a given number of filter coefficients and a summing device 9. This filter differs from that shown in FIG. 1 in that it is provided with two identical discarding devices 11 and 11' which, however, are not included in the feedback circuit 19 but are connected in the manner shown in FIG. 5 in the output lines 7($a$) and 7($b$) respectively of the multiplying device 7. However, this recursive filter, in which magnitude truncation of the two products signals is performed before these signals are summed, when compared to the recursive filter according to the invention in which only one discarding device is used which is included in the feedback circuit 19 provides a considerable decrease of the region of non-linear stability shown in FIG. 3. This decrease results in the non-linear stability region enclosed by a pentagon DEFCG shown in FIG. 6. The vertices of this pentagon DEFCG are given by the co-ordinates $(-1;-1)$; $(1;-1)$; $(1;0)$; $(0;1)$ and $(-1;0)$ respectively. As a comparison with FIG. 4 shows, the said considerable increase of the region of non-linear stability again results in an undesirable restriction of the possibilities of use; for example, low-pass filters and high-pass filters which are free from limit cycles cannot be realized.

The use of the steps according to the invention not only results in that the region of non-linear stability is extended to cover substantially the entire region of linear stability, but also the trapeziums ADEF and GBHK shown in FIG. 3 are found to contain only a discrete number of points which correspond to filter coefficients $(a, b)$ for which the recursive filter is unstable, unlike for example the regions shown in FIG. 6 which are enclosed by the triangles ADG and EBF and which exclusively contain points which correspond to combinations of filter coefficients $(a, b)$ for which the recursive filter is unstable. Thus the use of the steps according to the invention also ensures that, in addition to digital band-pass filters, digital high-pass filters and low-pass filters of very high quality factor can be realized without the occurrence of limit cycles, namely, by using filter coefficients $(a, b)$ corresponding to a stable filter which are given by points situated within the trapeziums ADEF (for high-pass filters) and GBHK (for low-pass filters).

It should be noted that it can mathematically be shown that the quality factor of a second-order recursive digital filter is proportional to $1/1- b$ , where $b$ represents the absolute value of the filter coefficient $b$ which for realizing filter characteristics is continuously negative ($b<0$).

Owing to the said expansion of the region of non-linear stability the recursive filter according to the invention is particularly suitable for realizing higher-order digital filters (for example of the order of 4 or more), for these higher-order filters can in conventional manner be built up from a cascade circuit including a plurality of second-order recursive digital filter sections according to the invention. It is true that different combinations of filter combinations are applied to these filter sections, however, the abovedescribed expansion of the region of non-linear stability enables these combinations to be selected so that each filter section is free of limit cycles, so that in the higher-order digital filter realized in this manner, even if it has a high quality factor, no undesirable output signal of possibly large amplitude occurs. The latter condition is produced, for example, if one or more of the constituent recursive digital filter sections is or are not free from limit cycles. The processing of these limit cycles in successive filter sections may give rise to a build-up of their amplitudes.

FIG. 7 shows another embodiment of the recursive digital filter according to the invention in which the possibilities of use, which are already extended by using only one discarding device, are further extended. The recursive digital filter shown in FIG. 7 largely corresponds to that of FIG. 1 and hence elements corresponding to FIG. 1 are designated by like reference numerals. The recursive digital filter shown in FIG. 7 also has an input 1, two delay devices 4 and 5, a summing device 9 the output signal of which is applied to a feedback circuit 19 which is provided with a discarding device 11 and the output signal $z(n)$ of which is applied via a common branch point 18 to two multipliers 8(1) and 8(2) in the multiplying device 7 to which are also applied filter coefficients $a$ and $b$ respectively from a source 10 of a given number of filter coefficients. However, this recursive filter is distinguished from the filter of FIG. 1 in that the feedback circuit 19 includes, in cascade with the delay device 5 and the discarding device 11, a switching device 21 a signal input of which is coupled to the output of the discarding device 11 and the output of which is coupled to the line 20. The switching device is controlled by switch pulses which are applied to a switch pulse input of the switching device 21 and are derived from a control circuit 22 which is controlled by the output pulses from the clock pulse generator 6 and includes a counter 23. The controlled circuit 22 applies a switch pulse to the switching device 21 whenever a given number of clock pulses from the clock pulse generator 6 have appeared. Whenever such a switch pulse appears the switching device 21 inverts at least one bit of the binary number which is applied to the switching device and consists, for example, of 6 magnitude bits.

In the embodiment shown in FIG. 7 the bits of the numbers at the output of the discarding device occur, for example, in series and at equidistant time intervals in the order from the least significant magnitude bit to the most significant magnitude bit, which latter in turn is followed by the sign bit. After, for example, every 64 clock pulses from the clock pulse generator 6 the counter 23 delivers a switch pulse which is applied to the switching device 21 via a monostable multivibrator 24 having a time constant which at most is equal to the time between 2 successive bits in the binary numbers. Thus a switch pulse is obtained the duration of which is at most equal to the time between two successive bits and which coincides with the occurrence of the least significant bit in the number at the output of the discarding device. In this embodiment the switching device 21 comprises a modulo-2 gate the signal input of which is connected to the output of the discarding device 11 and the output of which is the line 20. Thus this modulo-2 gate at the occurrence of a switch pulse ("1") in each sixty-fourth number at the output of the discarding device 11 converts a least significant "0" bit to a "1" bit and a least significant "1" bit to a "0" bit, while in the absence of a switch pulse "0" the applied bits in the binary numbers are not changed.

Owing to the selection of combinations of filter coefficients $(a, b)$ which are situated in either of the trapeziums ADEF and GBHK of FIG. 3 and which correspond to an instable filter, the use of the above-mentioned further step according to the invention permits ensuring that any limit cycles which may still occur in the recursive digital filter are completely suppressed, for investigation has shown that, for example in contradistinction to the recursive filter shown in FIG. 5, only a very limited number of limit cycles of different amplitude, for example only one such limit cycle, can occur in the filter shown in FIG. 1. The use of the above-described inversion of, for example, the least significant bit of a number applied to the switching device 21 disrupts the limit cycle, i.e. the periodically occurring sequence of binary numbers, so that by repeated processing of these numbers in the recursive filter their magnitudes converge to zero.

FIG. 8 shows a modified embodiment of the filter shown in FIG. 1. In the filter of FIG. 8, which largely corresponds to the filter of FIG. 1, elements corresponding to those of FIG. 1 are designated by like reference numerals. The filter of FIG. 8 differs from that of FIG. 1 only in the location of the discarding device 11, which in the filter of FIG. 8 is included in the feedback circuit between the output of the summing device 9 and the input of the delay device 5, the output signal from the summing device 9, being directly applied to an input of the discarding device 11. Thus in this recursive filter bits of the numbers in the sum signal $s(n)$ at the output of the summing device 9 are discarded instead of bits of the sum signal $s(n-1)$ at the output of the delay device 5, without the region of non-linear stability shown in FIG. 3 being affected.

FIG. 9 shows another modification of the recursive filter of FIG. 1. In the filter of FIG. 9, which largely corresponds to the recursive filter of FIG. 1, elements corresponding to those of FIG. 1 are again designated by like reference numerals. In the recursive digital filter shown in FIG. 9 the discarding device 11 is again included between the output of the delay device 5 and the branch point 18. However, the filter shown in FIG. 9 differs from that shown in FIG. 1 in the location of the summing device 2 which has an input 1 and, without the region of non-linear stability shown in FIG. 3 being affected, is included in the feedback circuit 19 between the output of the summing device 9 and the input of the delay device 5, the sum signal $s(n)$ being directly applied to a second input of this summing device 2, while the product signal which appears at the output of the multiplier 8(2) is directly applied to the delay device 4.

FIG. 10 shows a further modified embodiment of the digital recursive filter of FIG. 1. In this Figure also, elements which correspond to those of FIG. 1 are designated by like reference numerals. The second-order recursive digital filter of FIG. 10 is generally referred to as the transpose configuration of the digital filter of FIG. 1. This transpose configuration, which has the same transfer characteristic as the filter in FIG. 1, is obtained from the filter of FIG. 1 in that each branch point is replaced by a summing device and each summing device is replaced by a branch point, while furthermore the directions of the signals are reversed.

More particularly, the second-order recursive digital filter of FIG. 10 also has an input 1, which is an input of the second summing device 2, an output 17, two delay device 4 and 5, and a summing device 9 the output signal from which is applied to the feedback circuit 19, which in this embodiment comprises the output of the summing device 9, the summing device 2, the delay device 4 and the common branch point 18.

This embodiment also has a multiplying device 7 comprising two multipliers 8(1) and 8(2). The outputs 7(a) and 7(b) respectively of these multipliers are directly connected to inputs of the summing device 9. For the recursive digital filter of this Figure also, the region of non-linear stability shown in FIG. 3 is realized in that the discarding device 11 is included in the feedback circuit 19 between the output of the summing device 9 and the common branch point 18. Although in this embodiment the discarding device 11 is included between the output of the summing device 9 and an input of the summing device 2, it may alternatively be included between the output of the summing device 2 and the input of the delay device 4 or between the output of the delay device 4 and the common branch point 18.

As mentioned hereinbefore, such a second-order recursive digital filter of the above-described type may be used as a module for higher-order digital filters and in conjunction with non-recursive digital filters. FIG. 11 shows such a combination of a non-recursive and a recursive digital filter according to the invention in more detail. In the filter of FIG. 11, the transfer characteristic of which contains two poles and two zeros the recursive part has a structure similar to the embodiment shown in FIG. 1, elements corresponding to FIG. 1 being designated by like reference numerals. In the filter of FIG. 11 also the recursive part comprises two delay devices 4 and 5, a multiplying device 7 having two multipliers 8(1) and 8(2) and a summing device 9 which in the manner shown in the Figure is included between the output of the delay device 4 and the input of the delay device 5 and from which the sum signal $s(n)$ is derived. This recursive part is also provided with a feedback circuit 19 which at one end is connected to the output of the summing device 9 and at the other end to the branch point 18. The location of the discarding device 11 also is equal to that in FIG. 1. This recursive part, however, in contradistinction to the recursive digital filter of FIG. 1 is provided with three input circuits 2(1), 2(2) and 2(3) which in the manner shown are connected in cascade with the delay devices 4 and 5 and together with these delay devices 4 and 4 are used for realizing the non-recursive part of the filter. This non-recursive part comprises, in addition to the summing devices 2(1), 2(2) and 2(3) and the delay devices 4 and 5, three multipliers 25, 26 and 27 the outputs of which each are connected to an input of the summing devices 2(1), 2(2) and 2(3) respectively. To each of these multipliers 25, 26 and 27 are applied the information signal $x(n)$ and a filter coefficient ($c$, $d$ and $e$ respectively) for producing product signals $c\cdot x(n)$; $d\cdot x(n)$ and $e\cdot x(n)$ respectively which are applied to the summing devices 2(1), 2(2) and 2(3) respectively for summing with signals fed back by the recursive part.

In the embodiment shown the filter coefficients which differ in magnitude and correspond to the relationship between the input signal $x(n)$ and the output signal $y(n)$ are derived from a source 28 of a given number of filter coefficients. This source 28, which similarly to the delay devices 4 and 5 and the discarding device 11 is controlled by the output pulses from the clock pulse generator 6, in analogy with the source 10 of FIG. 1 also delivers the filter coefficients $a$ and $b$ for the multipliers 8(1) and 8(2) respectively. Similarly to these filter coefficients $a$ and $b$ the filter coefficients $c$, $d$ and $e$ are in the form of binary numbers in fixed-point representation.

The embodiment of a second-order digital filter shown in FIG. 11 again may be used as a module for a higher-order digital filter, for example a fourth-order digital filter. For this purpose the output signal $y(n)$ is applied to a second second-order digital filter the structure of which is equal to the filter of FIG. 11, filter coefficients being used which differ in magnitude from the filter coefficients used in the digital filter of FIG. 11 but which also may be derived from the source 28. Similarly to the source 10 of FIGS. 1, 5, 7, 8, 9 and 10 the source 28 may comprise a read only memory (ROM) but may also be in the form of a random access memory (RAM).

FIG. 12 shows an embodiment of a discarding device suitable for use in the recursive digital filter according to the invention. This discarding device has an input circuit in the form of a shift register 12, an output circuit in the form of a shift register 13 and a transfer device 14. The shift register 12 comprises $q = m + r$ shift register elements 12(1) to 12 ($q$) and the shift register 13 comprises m shift register elements 13(1) to 13($m$), where $m$ is less than $q$.

The contents of the shift register elements 12(1) to 12($m$) are written, via the transfer device 14 comprising AND gates 14(1) to 14($m$), into the shift register elements 13(1) to 13($m$) respectively at the frequency of the pulses from the clock pulse generator 6.

The discarding device shown is arranged to convert $q$-bit numbers of a signal $s(n)$ into $m$-bit numbers of a signal $z(n)$, the bits in these numbers occuring in series. The bits of the numbers in the signal $s(n)$ are read into the shift register in a conventional manner and are shifted at the frequency of the output pulses from a frequency multiplier 15 controlled by the clock pulse generator 6. The bits of the numbers in the shift register 13 are shifted in the shift register in a usual manner and are read out at the frequency of the output pulses from a frequency multiplier 16 controlled by the clock pulse generator 6. The multiplication factor of the multiplier 15 is selected, for example, so as to be equal to the number of shift register elements $q$ in the register 12, and the multiplication factor of the multiplier 16 is selected, for example, so as to be equal to the number of shift register elements $m$ in the register 13.

If in the usual manner the successive bits of the numbers of the signal $s(n)$ have increasing weights according to the sequence for numbers in fixed-point representation:

$$(\tfrac{1}{2})^q; (\tfrac{1}{2})^{q-1}; (\tfrac{1}{2})^{q-2}; \ldots; (\tfrac{1}{2})^m \ldots; (\tfrac{1}{2})^2; (\tfrac{1}{2})$$

then by means of the discarding device shown in FIG. 12 all those bits of the numbers written into the register 12 at the frequency of the output pulses of the multiplier 15 whose weights are less than $(\tfrac{1}{2})^m$, so that the signal $z(n)$ comprises numbers which each contain only the first $m$ bits of the numbers of the signal $s(n)$.

Besides the embodiment of a discarding device shown in FIG. 12 other embodiments may be used, because, as will be clear, the invention is not restricted to the discarding device shown in FIG. 12. In particular it should be mentioned that the concept of a discarding device shown in FIG. 12 may also be used when the $q$ bits of the numbers of the signal $s(n)$ appear in parallel. In this case these bits can simultaneously be written through parallel lines into the register elements 12(1) to 12($q$) and be transferred through the register 13 in the manner described. In this concept the frequency multiplier 15 may be dispensed with and the output pulses from the multiplier 15 which act as shift pulses for the shift register elements need not be generated. If the bits of the numbers of the signal $z(n)$ also are required to be simultaneously available through the parallel output lines of the register elements 13(1) to 13($m$), no shift pulses need be applied to the register elements 13(1) to 13($m$), so that the multiplier 16 also may be omitted.

Although the above is based on numbers given in sign-snd-magnitude representation, numbers given in another representation, for example in the twos complement or ones complement representation, may also be used. However, when numbers in such a representation are used the input circuit of the discarding device must additionally be provided with a conversion device which in known manner converts them to numbers in sign-and-magnitude representation while the output circuit of the discarding device must additionally be provided with a conversion device which converts the numbers given in sign-and-magnitude representation to numbers in the representation used in the filter. In two's or one's complement representation, the "discarding device" in the drawing, and operation of "discarding" is to be interpreted as including such conversion devices, and representing a magnitude truncator, or magnitude truncation.

It should be mentioned, that although in the embodiments of FIGS. 1, 7, 8, 9, 10 and 11 only two delay devices are shown, more than two delay devices may also be used, resulting in a higher-order (for example third-order) recursive digital filter. Furthermore the delay devices may be arranged so as to be suitable for storing more numbers, for example numbers of different signals transmitted in time multiplex.

It should further be mentioned that the information signal designated in the embodiments shown by $x(n)$ may characterize, instead of the instantaneous magnitude and sign of an analog information signal, changes in the instantaneous magnitude of the analog information signal, for example in the form of delta modulation or differential pulse code modulation.

Although the switching device 21 and the control circuit 22 required for further expansion of the field of application of the recursive digital filter according to the invention are shown in the embodiment of FIG. 7 only, the switching device 21 and the control circuit 22 may also be used in the remaining embodiments shown of the filter according to the invention. In addition, the use of these elements is not limited to numbers the constituent bits of which occur in series, but they may also be used when the constituent bits of numbers which appear at the output of the discarding device appear in parallel. In this case the monostable multivibrator may even be dispensed with. Also, for this further expansion the delay device 5 may be included between the output of the discarding device 11 and the signal input of the switching device 21 or have its input connected to the output of the switching device 21.

In contradistinction to the embodiments shown, in all of which the multiplying device 7 comprises two multipliers (1) and 8(2) which simultaneously multiply an applied feedback signal $z(n)$ by filter coefficients $a$ and $b$ respectively, the multiplying device 7 may comprise a single multiplier to which the numbers $z(n)$ to be multiplied by the filter coefficients $a$ and $b$ respectively are applied in time multiplex and from which similarly the two product signals $a \cdot z(n)$ and $b \cdot z(n)$ are derived in time multiplex, whereupon they are divided between the two output lines 7($a$) and 7($b$) respectively.

What is claimed is:

1. A digital filter comprising
   input means for receiving input digital signals to be filtered;
   arithmetic means, having a first input connected to said input means, a second input, and an output, for performing a predetermined arithmetic operation on said input digital signals;
   delay means, having an input connected to said output of said arithmetic means, and an output for producing a predetermined delay; and
   feedback means, connected to said output of said delay means for providing a feedback signal which is applied to said second input of said arithmetic means, comprising discarding means for discarding a predetermined number of less significant bits.

2. A digital filter as defined in claim 1, wherein said feedback means comprises a switching device for inverting at least one bit of a digital signal applied thereto from said delay means.

3. A digital filter comprising
   input means for receiving input digital signals to be filtered;
   clock means for generating clock pulses;

arithmetic means having an input and an output, for performing a predetermined arithmetic operation on said input digital signals, controlled by said clock pulses; and feedback means, operatively controlled by said clock pulses for discarding at least a portion of the digital signals between said output of said arithmetic means and said input of said arithmetic means.

4. A digital filter comprising input means for receiving input digital signals to be filtered;

coefficient generator means for supplying at least two filter coefficients;

multiplier means, having a first input connected to said coefficient generator means, a second input, and an output circuit;

delay means, having an input connected to said input means and to said output circuit of said multiplier means, and an output; and output means, coupled to said output of said delay means and said second input of said multiplier means, for providing output digital signals, said output means having an input connected to said delay means, and an output connected to said second input of said multiplier means, for discarding less significant bits;

5. A digital filter as defined in claim 4, further comprising summing means for summing the signals from said output circuit of said multiplier means and applying the summed signals to said output means;

6. A digital filter as defined in claim 4, wherein said delay means comprises at least two digital delay devices connected in series.

7. A digital filter as defined in claim 4, wherein said output circuit comprises two output lines connected to two respective summing devices.

8. A digital filter as defined in claim 7, wherein said delay means comprises a delay device connected between said two summing devices.

9. A digital filter comprising input means for receiving input digital signals to be filtered;

coefficient generator means for supplying filter coefficients;

multiplier means, having a first input connected to said coefficient generator means, a second input, and an output;

summing and truncating means, having a first input connected to said input means, a second input connected to said output of said multiplier means, a first output for providing output digital signals, and a second output; and delay means, having an input connected to said second output of said summing means, and an output connected to said second input of said multiplier means.

10. A digital filter as defined in claim 9, wherein said summing and truncating means comprise a first summing device, having an input connected to said output of said multiplier means, and an output;

a truncating device for discarding a predetermined number of bits, having an input connected to said output of said first summing device, and an output; and a second summing device, having a first input connected to said input means, and a second input connected to said output of said truncating device.

11. A digital filter as defined in claim 9, wherein said delay means comprise first and second delay devices, having a branch point, interposed between said first and second delay devices, connected to said multiplier means.

* * * * *

UNITED STATES PATENT AND TRADEMARK OFFICE
CERTIFICATE OF CORRECTION

PATENT NO. : 3,997,770
DATED : Dec. 14, 1976
INVENTOR(S) : THEODOOR ANTONIUS CAREL MARIA CLAASEN ET AL

It is certified that error appears in the above-identified patent and that said Letters Patent are hereby corrected as shown below:

Column 7, line 23, "1/1- b" should be $-- \frac{1}{1-/b/} --$ line 23, "b" should be --/b/--

Signed and Sealed this

Twenty-first Day of June 1977

[SEAL]

Attest:

RUTH C. MASON
*Attesting Officer*

C. MARSHALL DANN
*Commissioner of Patents and Trademarks*